United States Patent [19]
Fickes et al.

[11] Patent Number: 6,080,525
[45] Date of Patent: Jun. 27, 2000

[54] PROCESS FOR FORMING IMAGES ON PERMANENT SUBSTRATES

[75] Inventors: Daphne Pinto Fickes, Kennett Square; Jeffrey Wayne Milner, Rome; Harvey Walter Taylor, Jr., Sayre, all of Pa.

[73] Assignee: E. I. du Pont de Nemours and Company, Wilmington, Del.

[21] Appl. No.: 09/170,748

[22] Filed: Oct. 13, 1998

[51] Int. Cl.$^7$ .................. G03F 7/34; G03C 5/46
[52] U.S. Cl. .............. 430/291; 430/256; 430/258; 430/56
[58] Field of Search ................ 430/291, 256, 430/56, 32, 33, 34, 35, 257, 258

[56] References Cited

U.S. PATENT DOCUMENTS

| | | | |
|---|---|---|---|
| 3,639,268 | 2/1972 | Jaffe et al. | 252/437 |
| 4,174,216 | 11/1979 | Cohen et al. | 430/257 |
| 4,247,619 | 1/1981 | Cohen et al. | 430/253 |
| 4,604,340 | 8/1986 | Grossa | 430/270 |
| 5,011,754 | 4/1991 | Ono | 430/15 |
| 5,122,437 | 6/1992 | Matthews et al. | 430/291 |
| 5,565,301 | 10/1996 | Bodager | 430/257 |
| 5,587,272 | 12/1996 | Grossa et al. | 430/257 |
| 5,620,822 | 4/1997 | Kato et al. | 430/49 |
| 5,800,962 | 9/1998 | Benzing et al. | 430/259 |

FOREIGN PATENT DOCUMENTS

| | | |
|---|---|---|
| 0394936 | 10/1990 | European Pat. Off. . |
| 0685765 | 6/1995 | European Pat. Off. . |
| 0851306 | 1/1998 | European Pat. Off. . |
| 4228141 | 9/1993 | Germany . |
| 1269218 | 5/1994 | Italy . |
| 002128721 | of 0000 | Japan . |

*Primary Examiner*—Janet Baxter
*Assistant Examiner*—Yvette M Clarke

[57] ABSTRACT

A method for forming images on a substrate wherein imaging is performed on a photosensitive element, the method including the steps of (a) providing a photosensitive element having a support, a dry strippable layer and a first photosensitive layer, wherein the dry strippable release layer is present between the support and the photosensitive layer; (b) imaging the photosensitive element; (c) toning to form a photosensitive element having an imagewise toned surface; (d) applying an additional photosensitive layer to the imagewise toned surface of the photosensitive element; (e) forming a final imaged element by removing the support from the toned, photosensitive element; and (f) placing the final imaged element on the substrate to form a final image on the substrate.

44 Claims, 1 Drawing Sheet

PROCESS FOR FORMING IMAGES ON PERMANENT SUBSTRATES

BACKGROUND OF THE INVENTION

This invention relates to a process for making at least one image on a variety of substrates. More particularly, this invention relates to a method wherein the at least one image is formed on a temporary receptor and then transferred to the final substrate.

Photosensitive elements are known to be useful in image reproduction processes in applications such as ceramic printing and color proofing.

Known ceramic printing processes have previously been generally used as a method of forming a picture pattern on the surface of glass, porcelains, ceramics and the like. For example, Italian Patent No. 1269218 discloses a process for transfer and fixation of monochromatic or polychromatic images, by the steps of: computer processing of the original positive image; printing at least one monochromatic image onto a photomechanical film and using this data and developing the film to form a screened positive; thermally laminating at least one photosensitive film on a support for ceramic transfer, resulting in a gelatin layer being present between the photosensitive film and the support; printing at least one screened positive by etch printing of the positive on the photosensitive film with light; developing with suitable colored powders for ceramics, glass or porcelain; immersing the element in water whereby the base support is separated from the gelatin and photosensitive film; applying the element onto the ceramic or similar support and drying; applying a common adhesive in a hydrocarbon thinner to the developed element and drying followed by uniform distribution of a powdered ceramic flux; and firing in a kiln at a temperature and for a time dependent on the type of support, flux and type of powders for the colors used. This process has several disadvantages. This process requires the separation of the support from the gelatin and photosensitive film by immersing it in water. Also, during this step, since the colored powder image is not protected it could be damaged resulting in a poor quality image.

Similarly, U.S. Pat. No. 5,011,754 discloses a pigment-transfer sheets and a method for decorating heat-resistant articles. The decorating pigment-transfer sheet comprises a water absorbing substrate sheet, a water soluble paste layer placed on the substrate sheet; at least one photosensitive resin layer placed on the paste layer, wherein the photosensitive resin layer has adhesive dot photoimages; and a glaze containing pigment layer deposited on the adhesive dot images of each photosensitive layer, whereby the pigment layer has good gradation and high resolution in compliance with the photoimages. A method is also described which comprises soaking said pigment-transfer sheet in water; removing the substrate sheet from the pigment-transfer sheet and placing the resulting element on a heat resistant article and drying; and firing the sheet and article at a temperature sufficient to burn away the photosensitive resin layer(s) and bond the pigment(s) onto the article, whereby the resulting pigment pattern has good gradation and high resolution in compliance with the photoimages. A transparent glaze layer may be provided over the pigment layer. However, one major disadvantage of this process is that it requires that the substrate sheet be removed by immersing the element in water.

However, a need still exists for a process for forming high resolution images without a washing step in water.

Photosensitive elements useful in color proofing usually include a support, a photosensitive layer and a cover sheet. The photosensitive layer is generally tacky prior to exposure. In use, the cover sheet is peeled off and the photosensitive layer is laminated to a receptor. The positive-working photopolymerizable elements are then exposed imagewise through an image bearing transparency to form an image having tacky and non-tacky areas. The tacky areas of the exposed element are then toned to form a colored image. Chu and Cohen, U.S. Pat. No. 3,639,268 describe a reproduction process using positive-working photopolymerizable elements. Negative-working photosensitive elements are also known which require a dual exposure to provide a negative image with tacky and non-tacky areas. Negative-working elements and their process of use are disclosed in U. S. Pat. Nos. 4,174,216 and 4,247,619.

In a surprint proof, the receptor to which the photosensitive element is laminated is also the final substrate of the formed image. All the colored images are superimposed, by, for example, multiple exposure, lamination or transfer, onto the receptor. However, because the receptor has to survive the imaging formation steps, this process limits the types of receptor on which this surprint image is formed. In addition, because the image formation steps are performed on the receptor, any deficiencies in the limited choice of receptors can affect the quality of the final image. Furthermore, the known processes limits the dimensions of a receptor. For example, known processes usually require that the receptor is flat so that image formation can occur on a flat surface; that the receptor is of a certain shape, thickness and size so that it could pass through equipment used during the image formation process steps.

A need therefore exists for a process for forming high resolution images on a variety of substrates. A need further exists for a process that prevents any deficiency in a substrate from affecting the image formation process.

SUMMARY OF THE INVENTION

The present invention provides an improved method for forming images wherein the image is transferred to a permanent substrate after image formation and wherein the washing step is eliminated.

In a first embodiment of the invention, the method comprises the steps of:

(a) providing a photosensitive element comprising a temporary support, a first photosensitive layer, and a release surface between the temporary support and the photosensitive layer;

(b) imaging the photosensitive element;

(c) toning with a toner material to form a toned surface on the photosensitive element;

(d) optionally applying a protective layer to the imagewise toned surface of the photosensitive element;

(e) forming a final imaged element by removing the temporary support from the toned, photosensitive element; and (f) placing the final imaged element from the previous step on the substrate to form a final image on the substrate.

In a second embodiment of the invention, the toner material includes a sinterable component capable of being fired, the substrate in step (f) is capable of withstanding at least about 250° C., and the element from step (f) is fired at a sufficient temperature for a sufficient time to form a fixed image on the substrate.

In another embodiment, the present invention includes a photosensitive element comprising, in order, a support, a dry strippable layer, a photosensitive layer having imagewise toned and untoned areas and a protective layer.

In still another embodiment, the present invention includes a final proof having a substrate, a dry strippable layer, a first photosensitive layer having imagewise toned and untoned areas and a protective layer.

Optionally a dry strippable layer between the temporary support and the photosensitive element may provide the release surface. The dry strippable layer, when present, may be a release layer or a cushion layer or a combination of a release layer and a cushion layer. If both the release and cushion layers make up the dry strippable layer, then the layers will have to be compatible with each other and have the right adhesion balances throughout the required processing steps. If both layers are present on the temporary support, either the cushion or release layers may be adjacent to the temporary support. Preferably, the release layer is adjacent to the temporary support.

The release layer comprises a compound selected from polyvinyl alcohol, polyvinyl pyrrolidone, polyethylene oxide polymers, crosslinked polyvinyl alcohol, plasticized polyvinyl alcohol, crosslinked polyvinyl pyrrolidone and neutralized carboxylic acid-containing polymers, silicones, melamine acrylic resins, vinyl chloride polymers or copolymers, vinyl acetate polymers or copolymers, ethylene polymers or copolymers, propylene polymers or copolymers and combinations thereof The cushion layer comprises a compound selected from ethylene/vinyl acetate copolymers; ethylene/methacrylic acid copolymers and ionomers; ethylene/acrylic acid copolymers and ionomers; ethylene/methacrylate copolymers; ethylene/methacrylic acid/isobutylacrylic acid ionomers; and combinations thereof The invention provides a process for forming images on a greater variety of substrates. In an embodiment that does not employ a firing step, the choice of substrate is not limited by the process steps. Therefore, the process forms an image on various types of substrates of dimensions (size, curvature, thickeness). In an embodiment that fires the image-bearing element, the process excludes a washing step.

The invention itself, together with further objects and attendant advantages, will best be understood by reference to the following detailed description, taken in conjunction with the accompanying drawings.

Figure 1:
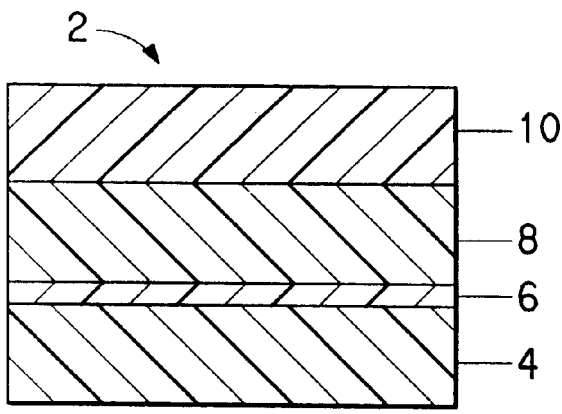
FIG. 1 is a schematic view of a photosensitive element useful in the present invention.

DETAILED DESCRIPTION OF THE PREFERRED EMBODIMENT Photosensitive element:

FIG. 1 shows a photosensitive element 2 including a temporary support 4, a release surface 6, a first photosensitive layer 8, and an optional strippable support 10. The photosensitive element 2 may be prepared from two separate components 20, 30 as best seen in FIGS. 2 and 3.

Figure 2:
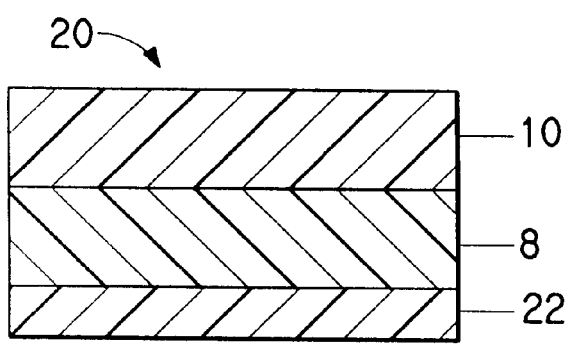
FIG. 2 is a schematic view of a first component useful for forming the element of FIG. 1.

Referring to FIG. 2, the first component 20 includes the optional strippable support 10, the photosensitive layer 8 and a strippable cover sheet 22, wherein the strippable support 10 has greater adhesion to the first photosensitive layer 8 than to the strippable cover sheet 22. This first component 20 may be a positive or negative working element. Some useful positive working photohardenable elements are disclosed in Assignee's U.S. Pat. Nos. 3,649,268; 4,734,356 (positive working photopolymerizable elements including a support layer, a photopolymerizable layer having a binder component, an ethylenically unsaturated monomer component and a photopolymerizable initiator, and optionally a cover sheet); U.S. Pat. No. 4,849,322 (a multi-layer element comprising (1) coversheet, (2) photohadherent layer, and (3) tonable contiguous layer; U.S. Pat. Nos. 4,892,802; and 4,948,704, the disclosures of which are incorporated herein by reference. Some useful negative working elements are disclosed in Assignee's U.S. Pat. No. 4,174,216 (negative working proofing film including a support layer, and a photopolymer layer including a diacrylate or dimethacrylate ester of bisphenol A/epichlorohydrin epoxy resin monomer, a compatible polymeric binder, and a photopolymerization initiator) and U.S. Pat. No. 4,247,619, the disclosures of which are incorporated herein by reference. Some useful phototackifiable systems are disclosed in U.S. Pat. Nos. 4,604,340 and 4,698,293.

Figure 3:
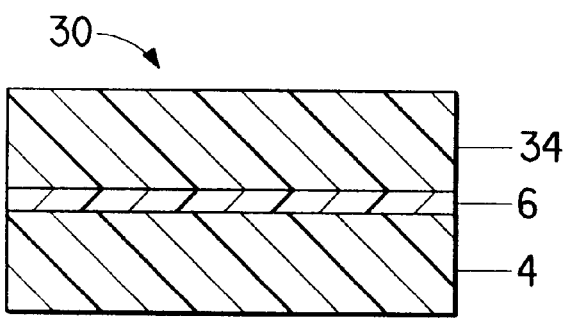
FIG. 3 is a schematic view of a second component useful for forming the element of FIG. 1.

Referring to FIG. 3, the second component 30 includes the temporary support 4 having a release surface 6 over it. The second component 30 also includes an optional cover sheet 34 over the release surface 6 for protection prior to use.

The release surface 6 may be provided on a surface of the temporary support 4, a surface of the first photosensitive layer 8, or, as best seen in FIGS. 1 and 3, the release surface may be provided on a separate layer disposed between the temporary support 4 and the first photosensitive layer 8. Where the release surface 6 is a surface on either the temporary support 4 or the first photosensitive layer 8, it is provided by treating or coating a surface of the temporary support 4 or the first photosensitive layer 8 with a material that allows removal of the temporary support 4 from the first photosensitive layer 8 by, for example, peeling; at the same time the material allows the first photosensitive layer 8 and temporary support 4 to adhere to each other during exposure processing. A support material having suitable surface treatment include, but is not limited to, Kraft paper. Other suitable surface treatment materials include, but are not limited to, polyester.

In the illustrated embodiment, the release surface 6 is a dry-strippable layer. The dry-strippable layer, when present, may be a release layer, a cushion layer or a combination of the two layers (combination not shown). If the release and cushion layers are used in combination as the dry-strippable layer (release+cushion strippable layer), then the layers should be compatible with each other so that components in one layer do not deleteriously react with components in the other layer. Additionally, the layers should have the right adhesion balances to provide the appropriate separation point throughout the processing steps. It is understood that the separation point of the release+cushion strippable layer may vary depending on the application. "Separation point" refers to the desired interface at which the layers should separate. For example, where the release+cushion strippable layer is provided in the structure, the separation point may be between the release and the cushion layer; between the temporary support 4 and the layer (release or cushion layer) next to it; or between the first photosensitive element 8 and the layer (release or cushion layer) next to it.

Where the release+cushion strippable layer is used (not shown), either the cushion or release layers may be adjacent to the temporary support 4. Preferably, the release layer is adjacent to the temporary support 4.

The photosensitive element 2 is prepared by stripping the cover sheets 22, 34, where present, and laminating the first component 20 and second component 30 together with the photosensitive layer 8 adjacent to the release surface 6. Optionally, the strippable support 10 adjacent to the photosensitive layer 8 may then be peeled off depending on the imaging technique to be used.

Alternatively, the photosensitive element 2 may be prepared by coating the release surface 6 (such as the dry strippable layer), and photosensitive layer 8 onto the temporary support 4 and drying. It may be necessary to dry the dry release surface 6 prior to application of the photosensitive layer 8 to remove solvent from the release surface coating.

The temporary support 4 is the receptor during the image formation process. Therefore, the temporary support 4 may be made of any material suitable as a receptor, such as any material which has reasonable stiffness and dimensional stability. Materials with sufficient stiffness and dimensional stability are those which are capable of supporting an image without allowing it to shift and/or misalign. The temporary support 4 is generally smooth and flat. Examples of suitable materials which can be used include polymeric films such as polyesters, including polyethylene terephthalate and polyethylene naphthanate; polyamides; polycarbonates; fluoropolymers; polyacetals; polyolefins; etc. The temporary support 4 can also be a thin metal sheet, a paper substrate or a synthetic paper. A preferred support material is polyethylene terephthalate film. The temporary support 4 typically has a thickness of between about 20 and about 250 micrometers (1.0 to 10 mils). A preferred thickness is between about 75 and about 200 micrometers (3 to 8 mils).

A suitable release layer includes a compound selected from silicones, melamine acrylic resins, plasticized polyvinyl alcohol, vinyl chloride polymers or copolymers, vinyl acetate polymers or copolymers, ethylene polymers or copolymers, propylene polymers or copolymers and combinations thereof.

If the dry strippable layer 6 includes a release layer, the release layer generally has a thickness in the range of between about 1 and about 10 micrometers.

A suitable cushion layer is a deformable layer which is generally thicker than a release layer. The composition of such a cushion layer should be chosen so as to produce the appropriate adhesive strength relative to strippable support 10 on the first component 20. The cushion layer includes compounds selected from ethylene/vinyl acetate copolymers; ethylene/methacrylic acid copolymers and ionomers; ethylene/acrylic acid copolymers and ionomers; ethylene/methacrylate copolymers; ethylene/methacrylic acid/isobutylacrylic acid ionomers; and the like. Combinations of materials can also be used. Preferred materials for the cushion layer are ethylene/vinyl acetate copolymers. These compounds are commercially available under the tradenames Surlyn® and Nucrel® (E. I. du Pont de Nemours and Company, Wilmington, Del., and the tradename Iotek (Exxon Chemical Company, Houston, Tex.).

If the dry strippable layer includes a cushion layer, the cushion layer generally has a thickness in the range of between about 25 and about 150 micrometers (1 to 6 mils); preferably between about 75 and about 125 micrometers (3 to 5 mils).

The release or cushion layer may also include materials such as surfactants, plasticizers, coating aids, and the like. While colorants, antihalation dyes, optical brightener, etc., are also optional ingredients, they are not generally used in the cushion layer as they serve no added purpose in this layer.

Where the release surface 6 is a dry strippable layer, a barrier layer (not shown) may also be provided on the dry strippable layer to further facilitate the dry release property. When present, this barrier layer may be placed between the dry strippable layer and the photosensitive layer 8, or, alternatively, between temporary support 4 and the dry strippable layer. This barrier layer can be made of any material that provides further facilitates the dry release property, such as for example a polyester sheet, or a photosensitive layer which has been given an overall exposure. This barrier layer may be applied by lamination or coating onto the dry strippable layer.

In order to ensure adequate adhesion of the previously described release layer to the support, it is sometimes necessary to include one or more anchor layers (not shown) between them. Any conventional adhesive materials can be used in the anchor layer(s). Adhesive materials for bonding different types of materials are well known in the art and discussions can be found in, e.g., Handbook of Adhesives, 2nd Edition, Irving Skeist, Ed. (Van Nostrand Reinhold Co., New York, 1977). Suitable materials for use as the transfer anchor layer include, for example, ethylene/vinyl acetate copolymers; vinyl chloride/vinyl acetate copolymers; vinyl chloride/vinylidene chloride copolymers; thermoplastic polyamides; and the like. The choice of adhesive will depend on the compositions of the cushion layer the release layer and the transfer support. The anchor layer or layers can have incorporated therein materials such as antistats, colorants, surfactants, plasticizers, coating aids, and the like.

The anchor layer generally has a thickness in the range of between about 0.1 and about 10 micrometers; preferably between about 0.5 and about 2 micrometers. When more than one anchor layer is present, the total thickness of the layers is generally in the above range.

Optionally, a temporary coversheet (not shown) may be present over the outermost layer, which could be either the release layer or the cushion layer, to protect the underlying layers, if necessary, and must be easily removable.

The release and cushion layers may be chosen to have less adhesion to the photosensitive layer 8 than the temporary support 4 so that they may be removed along with the support in step (e) or they may be selected so that the adhesion to the photosensitive layer 8 is greater than to the support resulting in the release and cushion layers being left behind on the photosensitive layer in step (e).

Preferably, the dry strippable layer 6 includes both a release and a cushion layer. A second component 30 including both release and cushion layers as the dry strippable layer is described in more detail in U.S. Pat. No. 5,534,387 under the heading "Transfer Element", the disclosure of which is incorporated by reference.

Final Substrate

One advantage of the process of this invention is that the final substrate for the image can be chosen from any substrates that can support a formed image. The substrate can be of any material and any dimension, such as size, thickeness, shape or curvature, so long as it is sufficient to support the formed image. The choice of substrate is therefore often determined by product application. Selected examples of product applications are briefly described below.

For applications generally referred to as "ceramic printing," the permanent substrate for the final colored image can be chosen from almost any material or article desired which will withstand the firing temperatures used in step (g). These firing temperatures typically is at least about 250° C., most often between about 250 and about 1500° C. Some useful permanent supports include, for example, ceramics such as pottery, stoneware, tile, bone china; glass; porcelain; and metals such as sheets or foils. The substrate may be in sheet form or bulk form and may be of any dimension (such as size, shape and curvature) that is sufficient to provide a surface on which an image can be fixed.

For applications such as color proofing, cellulose and non-cellulose type substrates may be used to advantage, with porous cellulose type substrates, such as paper, being preferred. If sized, a commercially useful degree of sizing for the substrate can be from 1 second to 1000 seconds as measured by the Hercules size test (HST), as described in TAPPI standards T530 PM-83. The substrate is chosen so its HST value is compatible with the volume and composition of the ink drop in the printer to be used. The preferred HST is in the range of 200 to 500 seconds, most preferably 350 to 400 seconds. Some useful papers are copier grade paper, 100% bleached kraft composed of a blend of hard and soft wood, 100% wood free cotton vellum, and wood containing paper made translucent either by pulp beating or with additives. A preferred paper is Gilbert Bond paper (25% cotton) designated style 1057, manufactured by Mead Company, Dayton, Ohio. Standard resin coated papers used in the photographic industry such as polyclad papers, preferably polyethylene clad papers, also may be selected to advantage.

Some illustrative examples of substrates for transparencies, which are non-porous and usually have a thickness of about 50 to 125 microns (preferably from aabout 100 to about 125 microns), include polyester films such as Mylar® flexible film, commercially available from E. I. du Pont de Nemours and Company, Wilmington, Del.; Melinex® film, commercially available from Imperial Chemicals, Inc.; Celanar® film, commercially available from Celanese Corp.; polycarbonates such as Lexan® sheet film, commercially available from The General Electric Company, Fairfield, Conn.; polysulfones, cellulose triacetate; polyvinylchlorides; and the like. Mylar® polyester film is preferred because of its availability and low cost. Coated transparent films, such as gel subbed polyester films, or polyester films with white opaque coatings on them used as proofing receptors, are also useful in practicing the invention.

Other substrates, such as cardboard or fabrics, decorative surfaces such as for example, Corian® solid surfaces (E. I. du Pont de Nemours and Company), as well as others, may be selected for specialty applications.

Process Steps

The specific process step for forming images are generally dependent upon the product application and the materials used.

For all product applications, the process for forming images include the following steps: (a) providing a photosensitive element comprising a temporary support, a release surface and a first photosensitive layer; (b) forming an imaged element by imaging the photosensitive element; (c) forming a toned imaged element by toning the imaged element with a toning material; (d) optionally applying a protective layer on the toned imaged element; (e) forming a final element by removing the temporary support from the toned imaged element; and (f) placing the final element on a final substrate.

Where the product application is, for example, ceramic printing, the process also includes a step (g), wherein the final element on the final substrate is fired to form a fixed image.

These steps will now be described in more detail below.

Step (a)

The photosensitive element may be prepared as previously described.

Step (b)

The imaged element is formed by imaging the photosensitive element. In product applications such as, for example, ceramic printing and color proofing, the photosensitive element is imaged by, for example, exposure to actinic radiation. The exposure activates the imaging reaction in the photosensitive layer in a conventional fashion. "Actinic radiation" is any radiation which produces imaging. The radiation can be natural or artificial, monochromatic or polychromatic, incoherent or coherent. For efficient image formation, most of the actinic radiation should be absorbed by the photosensitive material. The absorption spectrum of the photosensitive material may be determined by conventional spectrophotometry.

Conventional sources of actinic radiation that may be selected include fluorescent, mercury vapor, mercury-xenon, metal additive, and arc lamps. Useful sources of coherent radiation, such as lasers whose emissions fall within or overlap the absorption bands of the photosensitive composition, may also be used. Exposure is ordinarily carried out through a halftone image-bearing transparency, preferably a halftone color separation transparency. However, other means, such as a modulated scanning laser beam, CRT (cathode ray tube), and the like, may be used to imagewise expose the photosensitive elements.

Positive or negative transparencies may be prepared by any technique know to those skilled in the art. The transparencies comprise a support having thereon an image bearing emulsion layer. The element is exposed to actinic radiation, typically through this separation transparency with the emulsion side of the transparency in contact with strippable support, if present, or the first photosensitive layer. Alternately, the transparency may be placed on the photosensitive element with its support side adjacent the strippable support, if present, or the first photosensitive layer. It is preferred to have a strippable support present on the first photosensitive layer, which if tacky as in a photohardenable system, could damage the transparency. Exposure is conveniently carried out in a standard vacuum frame to ensure good contact between the transparency and the strippable support, if present, or the first photosensitive layer.

Alternately, the origin of the information may be in digital form or in form of other image and type media which is converted into digital form. This converted form is then subjected to electronic addition, deletion or correction prior to obtaining the desired final image or text. The digital information is organized into distinct color planes that when recombined with the color values produce the original image. When this information is sent to a digital image recording device (e.g., a digital proofer, imagesetter, platesetter, etc.) each of the color planes is processed and normally imaged individually. This is a constraint of the image reproduction process that employs the additive color theory. These individual color planes are rasterized to produce individual and variable size dots that are used to drive an imaging energy source, e.g., a laser, to faithfully record the image data in the form of a collection of halftone dots on to the photosensitive layer. Some useful lasers include diode or argon lasers.

Step (c)

The optional strippable support 10, if present during the exposure step, is removed (for example, by peeling). The imaged element is then toned with toning materials to form a photosensitive element having an imagewise toned surface. As used herein, the term "toning" refers to a dry process. Toning can be accomplished by dusting with toning materials consisting primarily of fine particle powders or by means of toning films which consist of a substrate having thereon a loosely bound pigmented layer.

The composition of the toning material depends upon the product application.

Where the process is used to make a colored image, colored toners can be used. Some useful colored toners are those that include a support having thereon a transfer layer containing the toning material such as those disclosed in U.S. Pat. Nos. 3,909,282, 4,330,613 and 4,546,072, the disclosures of which are incorporated herein by reference. Some useful toning foils are disclosed in U.S. Pat. Nos. 5,126,226 and 4,806,451, the disclosures of which are incorporated herein by reference.

Where the process includes a firing step, the toning material should also include a sinterable component capable of being fired. Examples of a useful sinterable component include ceramic, glass, porcelain, metals, etc., and combinations thereof.

Step (d)

Optionally, a protective layer (not shown) can be applied to toned imaged element. This application can be performed by any useful method, such as, for example, by coating or lamination.

The protective layer can be any material known in the art useful for protecting the formed image. The protective layer should be nontacky, durable, and adhere well to the toned surface of the toned imaged element. Where the process includes a firing step, the protective layer should withstand the firing temperature. Alternatively, the protective layer may be provided after the firing step.

A material that can be used as a protective layer is an additional photosenstive layer that is overall exposed.

Step (e)

The final element is formed by removing the temporary support 4, for example by peeling, from the toned imaged element. The dry strippable layer, when present, may or may not be removed (for example, by peeling) along with the temporary support 4.

Step (f)

The final element from step (e) is then placed on the final substrate so that the release surface, is adjacent the final substrate. If the final element is larger than the final substrate the element may be trimmed to the size of the final substrate.

Step (g)

For applications such as ceramic printing, the substrate+ final element composite is then fired at a sufficient temperature and for a sufficient time to fix the image on the substrate. During the firing step, the organic components in the various layers are removed, and the sinterable component in the toning material reacts to form an image on the permanent substrate. The firing temperatures should be high enough to burn off the organic compounds without leaving residue. Temperatures in the range of between about 250 to about 1500° C. are considered useful. Preferably, the firing step occurs at temperatures in the range of between about 600 and about 1100° C., and more preferably in the range of between about 800 and about 1000° C.

It is understood that the actual firing temperature and firing time depends upon the decomposition temperatures of the element components, substrate, and organic composition.

Multi-layer and Multicolor Images

Multi-layer and/or multicolor images can be formed by applying one or more photosensitive layers after step (c).

For example, this additional photosensitive layer may be provided from a structure such as the first component 10. Forming a multi-layer and/or multicolor image can thus be achieved by repeating steps (b) through (d), after step (d), at least once with a different positive or negative transparency or a different color plane and different colored toning materials. For a four color image, cyan, magenta, yellow and black toning materials are used with their respective positive or negative transparencies or color planes.

The invention will now be further illustrated, but not limited, by the following examples.

EXAMPLES

Example 1

Making a 4-Color Proof

A 4-color proof was prepared using the following procedure:

A positive Cromalin® film, type ICFD having a coating weight of ~300 mg/dm$^2$, was laminated to a WaterProof® transfer sheet (E. I. du Pont de Nemours and Company, Inc.) at 250°0 F. The WaterProof® transfer sheet prior to lamination was provided with a barrier layer comprised of an overall exposed positive Cromalin® film. The element was exposed through a cyan positive separation on a Theimer Montekop light source with integrator (5 KW UV bulb) for 15 units. The cover sheet was peeled off the exposed element and the element was toned with cyan positive Cromalin® SOP toner. The sequence was repeated using the magenta, yellow and black separations. After the 4-color image was made, a 5th of layer of Cromalin® film was laminated and exposed for 150 units on the same exposure unit. The proof was turned over and exposed through the transparent base for another 150 units.

After the final exposure, the self-supported film containing the 4-color image was peeled away from the Water-Proof® transfer sheet support and placed upon LUSTRO GLOSS 100 paper purchased from Linden-Mayer-Monroe, Philadelphia, Pa. to provide four color image that had the "ink-on-paper type appearance.

Example 2

Making a 4-Color Proof On Paper

Example 1 was repeated with the following exception: the paper used for the final image transfer was WARREN FLOW 90 Paper purchased from Linden-Mayer-Monroe, Philadelphia, Pa. It was found that another paper useful for the final image transfer is available under the brand Vintage Gloss from Garrett Buchanan of Philadelphia, Pa.

Example 3

Making a 4-Color Image On Substrate To Be Fired

A four color image using positive Cromalin® toners (SOP toners) can be prepared on the adhesive side of a P-81 Cronar® polyester available from E.I. du Pont de Nemours and Company (Wilmington, Del.) as the support for the image. The four color image can be prepared in standard fashion (as described in U.S. Pat. No. 3,649,268) by the sequential steps of laminating on a temporary cardboard available from Sofco-Mead of Big Flates, NY, using a Cromalin® Laminator set at 250° F. (121° C.), exposing through a positive separation, removing the coversheet and toning with the corresponding colored toner. Standard exposures are for 15 units for each layer on a Theimer Montekop light source (Bridgeford, Conn.) with integrator (5 kW UV bulb). The process can be repeated three additional times for the other three colors. Useful colored toners are available from Haeraeus-pkf of Germany or from Stummvoll & Librizzi of Italy. The laydown sequence can be black, cyan, magenta and yellow. After the proof is made, a fifth layer of positive Cromalin® film material can be laminated to the proof and the proof can be blanket exposed for 150 units (10×exposure). Toning took place using a Cromalin® automatic toning machine with positive Cromalin® SOP toners.

This image may then be placed on the permanent receptor, trimmed and fired as described earlier.

Example 4

Making A 4-Color Image With Protective Layer

ICFD Positive Cromalin® film material (available from E.I. du Pont de Nemours and Company, Wilmington, Del.), with a coating weight ~300 mg/dm$^2$ can be laminated to the WaterProof® transfer sheet at 250° F., exposed through a cyan positive separation, coversheet removed and toned with cyan toner. The sequence can be repeated using the magenta, yellow and black separations. Typical imagewise exposure times are 15 units. After the 4 color image is made, a fifth layer can be laminated and exposed for 150 units (10× exposure). The proof can be turned over and exposed through the transparent base for another 150 units.

After the final exposure, the self-supported film containing the 4 color image could be peeled away from the WaterProof® transfer sheet support and placed upon any other different support.

Equipment etc.

Cromalin® laminator set at 250° F.

Light Source Theimer Montekop with integrator (5 KW UV bulb)

Toners—positive Cromalin® toners (SOP toners)

Cardboard—Newsboard from Sofco-Mead of Big Flates, N.Y.

Of course, it should be understood that a wide range of changes and modifications can be made to the preferred embodiment described above. It therefore is intended that the foregoing detailed description be regarded as illustrative rather than limiting and that it be understood that it is the following claims, including all equivalents, which are intended to define the scope of this invention.

What is claimed is:

1. A process for forming images on a final substrate having a first photsensitive layer with imagewise toned and untoned areas comprising the steps of
   (a) providing a photosensitive element comprising a temporary support, a first photosensitive layer, and a release surface between said temporary support and said first photosensitive layer;
   (b) imaging the photosensitive element;
   (c) toning the imaged photosensitive element with a toner material to form a toned surface on the imaged photosensitive element;
   (d) forming a final imaged element by removing the temporary support from the toned, photosensitive element; and
   (e) placing the final imaged element on the final substrate.

2. The process of claim 1 wherein:
   the toner material comprises a sinterable component;
   the substrate is capable of withstanding at least about 250° C.; and
   the element from step (e) is fired at a sufficient temperature for a sufficient time to form a fixed image on the substrate.

3. The process of claim 1 or 2, wherein the photosensitive element the release surface is provided by a dry strippable layer.

4. The process of claim 1 or 2, further including the step of applying a protective layer to the imagewise toned surface of the photosensitive element prior to step (d).

5. The process of claim 1 or 2, further including the step of applying at least one additional photosensitive layer on the imagewise toned surface of the photosensitive element.

6. The process of claim 3, wherein the dry strippable layer includes a release layer, a cushion layer or a combination thereof.

7. The process of claim 6, wherein the release layer comprises a compound selected from silicones, melamine acrylic resins, plasticized polyvinyl alcohol, vinyl chloride polymers or copolymers, vinyl acetate polymers or copolymers, ethylene polymers or copolymers, propylene polymers or copolymers and combinations thereof.

8. The process of claim 7, wherein the release layer has a thickness in the range of between about 1 and about 10 micrometers.

9. The process of claim 6, wherein cushion layer includes a compound selected from ethylene/vinyl acetate copolymers; ethylene/methacrylic acid copolymers and ionomers; ethylene/acrylic acid copolymers and ionomers; ethylene/methacrylate copolymers; ethylene/methacrylic acid/isobutylacrylic acid ionomers; and combinations thereof.

10. The process of claim 9, wherein cushion layer comprises an ethylene/vinyl acetate copolymer.

11. The process of claim 9, wherein cushion layer has a thickness in the range of between about 25 and about 150 micrometers.

12. The process of claim 3, wherein the photosensitive element further comprises a barrier layer between the dry strippable layer and the first photosensitive layer.

13. The process of claim 12, wherein the barrier layer comprises a photosensitive layer which has been overall exposed to actinic radiation.

14. The process of claim 1 or 2, wherein the photosensitive element is imaged using a transparency comprising a transparency support and an image bearing emulsion layer.

15. The process of claim 14, wherein the transparency is placed on the first photosensitive layer such that the emulsion layer is adjacent to the first photosensitive layer.

16. The process of claim 14, wherein the transparency is placed on the first photosensitive layer such that transparency support is adjacent to the first photosensitive layer.

17. The process of claim 14, wherein the transparency is a positive transparency.

18. The process of claim 1 or 2, wherein the photosensitive element is imaged using one color plane and a laser.

19. The process of claim 18, wherein the photosensitive element is imaged using a diode laser.

20. The process of claim 19, wherein the photosensitive element is imaged using an argon laser.

21. The process of claim 1 or 2, wherein the photosensitive element is a positive working element.

22. The process of claim 1 or 2, wherein the photosensitive element is a negative working element.

23. The process of claim 1 or 2, wherein the photosensitive element is phototackifiable.

24. The process of claim 1 or 2, wherein the toning material is a fine particle powder.

25. The process of claim 1 or 2, wherein the toning material is a pigmented toning film.

26. The process of claim 14, wherein after step (c) steps (b) and (c) are repeated at least once with a different transparency and a different toning material.

27. The process of claim 18, wherein after step (c) steps (b) and (c) are repeated at least once with a different color plane and a different toning material.

28. The process of claim 27, wherein the photosensitive element is imaged using a diode laser.

29. The process of claim 27, wherein the photosensitive element is imaged using an argon laser.

30. The process of claim 14, wherein the photosensitive element is imaged using actinic radiation.

31. The process of claim 1 or 2, wherein the first photosensitive layer is a photopolymerizable layer.

32. The process of claim 1 or 2, wherein the first photosensitive layer is a phototackifiable layer.

33. The process of claim 1, wherein the substrate is selected from a paper, polyester, and a decorative surface.

34. The process of claim 2, wherein the substrate is selected from a ceramic, a glass, a porcelain, metal, and combinations thereof.

35. The process of claim 2, wherein the firing temperature in step (f) is between about 800 and about 1000° C.

36. The process of claim 1, wherein the toning material is a colored toner.

37. The process of claim 1, wherein the toning material includes at least one metal, ceramic, glass, porcelain, and combinations thereof.

38. The process of claim 17, wherein after step (c) steps (b) and (c) are repeated at least once with a different color plane and a different toning material.

39. The process of claim 2, wherein the sinterable component is selected from ceramics, glass, porcelain, metals and combinations thereof.

40. The process of claim 1, wherein a firing step is excluded.

41. The process of claim 2, wherein a washing step is excluded.

42. The process of claim 3, wherein the photosensitive element of step (a) further includes a barrier layer between the photosensitive layer and the dry strippable layer.

43. A final imaged element comprising, in order:
 a support;
 a dry strippable layer;
 a photosensitive layer having imagewise toned and untoned areas therein; and
 a protective layer.

44. In a process for forming images on a final substrate by imagewise exposing a photosensitive element supported on a temporary support to form imaged and nonimaged areas on the photosensitive element and toning the exposed photosensitive element with a toner material to form a toned surface on the imagewise exposed photosensitive element; wherein, the improvement comprises forming a final imaged element by removing the temporary support from the toned, photosensitive element and placing the final imaged element together with the toned photosensitive element on the final substrate.

* * * * *